United States Patent
Seo et al.

(10) Patent No.: US 9,553,281 B2
(45) Date of Patent: Jan. 24, 2017

(54) LIGHTING DEVICE

(75) Inventors: Satoshi Seo, Kanagawa (JP); Hisao Ikeda, Kanagawa (JP); Tomoya Aoyama, Kanagawa (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 923 days.

(21) Appl. No.: 13/296,589

(22) Filed: Nov. 15, 2011

(65) Prior Publication Data
US 2012/0126268 A1 May 24, 2012

(30) Foreign Application Priority Data

Nov. 19, 2010 (JP) ................................. 2010-259052

(51) Int. Cl.
F21V 3/00 (2015.01)
F21V 5/00 (2015.01)
(Continued)

(52) U.S. Cl.
CPC ............ H01L 51/5275 (2013.01); F21S 6/003 (2013.01); F21V 5/045 (2013.01); G02B 3/0056 (2013.01);
(Continued)

(58) Field of Classification Search
CPC .......... G02B 3/08; G02B 3/0056; F21S 6/003; F21S 8/04; F21V 5/045; F21Y 2105/00; F21Y 2115/20; H01L 51/5275
(Continued)

(56) References Cited

U.S. PATENT DOCUMENTS

| 5,107,175 A | 4/1992 | Hirano et al. |
| 5,124,204 A | 6/1992 | Yamashita et al. |

(Continued)

FOREIGN PATENT DOCUMENTS

| CN | 101676615 A | 3/2010 |
| JP | 08-83688 | 3/1996 |

(Continued)

OTHER PUBLICATIONS

Reineke, et al., "White organic light-emitting diodes with fluorescent tube efficiency", Nature, vol. 459, May 14, 2009, pp. 234-239.

(Continued)

*Primary Examiner* — Peggy Neils
*Assistant Examiner* — Tsion Tumebo
(74) *Attorney, Agent, or Firm* — Nixon Peabody LLP; Jeffrey L. Costellia

(57) ABSTRACT

A lighting device is provided with a structure body which has an inner surface including a region with a negative Fresnel lens shape and a high refractive index material layer which is closely in contact with the inner surface. The high refractive index material layer has a Fresnel lens shape in a region closely in contact with the inner surface, and a plane light-emitting body is provided over the structure body with the high refractive index material layer interposed therebetween. The high refractive index material layer is provided so as to fill at least the negative Fresnel lens shape of the structure body and thus has a surface including the region with the Fresnel lens shape at the interface with the structure body.

30 Claims, 5 Drawing Sheets

(51) Int. Cl.
  *H01L 51/52* (2006.01)
  *F21S 6/00* (2006.01)
  *F21V 5/04* (2006.01)
  *G02B 3/00* (2006.01)
  *G02B 3/08* (2006.01)
  *F21S 8/04* (2006.01)
  *F21Y 105/00* (2016.01)

(52) U.S. Cl.
  CPC .. *G02B 3/08* (2013.01); *F21S 8/04* (2013.01); *F21Y 2105/00* (2013.01); *F21Y 2115/20* (2016.08)

(58) Field of Classification Search
  USPC .... 362/311.06; 359/726, 727, 728, 729, 730
  See application file for complete search history.

(56) References Cited

U.S. PATENT DOCUMENTS

| | | | |
|---|---|---|---|
| 5,189,405 A | 2/1993 | Yamashita et al. | |
| 5,315,377 A | 5/1994 | Isono et al. | |
| 5,317,349 A * | 5/1994 | Vanderwerf | 353/38 |
| 5,686,360 A | 11/1997 | Harvey et al. | |
| 5,693,956 A | 12/1997 | Shi et al. | |
| 5,757,126 A | 5/1998 | Harvey et al. | |
| 5,771,562 A | 6/1998 | Harvey et al. | |
| 5,811,177 A | 9/1998 | Shi et al. | |
| 5,952,778 A | 9/1999 | Haskal et al. | |
| 5,962,962 A | 10/1999 | Fujita et al. | |
| 6,146,225 A | 11/2000 | Sheats et al. | |
| 6,150,187 A | 11/2000 | Zyung et al. | |
| 6,198,217 B1 | 3/2001 | Suzuki et al. | |
| 6,198,220 B1 | 3/2001 | Jones et al. | |
| 6,219,113 B1 | 4/2001 | Takahara | |
| 6,268,695 B1 | 7/2001 | Affinito | |
| 6,274,887 B1 | 8/2001 | Yamazaki et al. | |
| 6,413,645 B1 | 7/2002 | Graff et al. | |
| 6,771,021 B2 | 8/2004 | Cok | |
| 6,847,163 B1 | 1/2005 | Tsutsui et al. | |
| 6,965,195 B2 | 11/2005 | Yamazaki et al. | |
| 6,987,613 B2 * | 1/2006 | Pocius et al. | 359/565 |
| 7,182,481 B2 * | 2/2007 | Shimura | 362/244 |
| 7,202,504 B2 | 4/2007 | Ikeda et al. | |
| 7,245,429 B2 * | 7/2007 | Yoshikawa et al. | 359/460 |
| 7,473,928 B1 | 1/2009 | Yamazaki et al. | |
| 7,554,263 B2 | 6/2009 | Takahashi | |
| 7,663,312 B2 | 2/2010 | Anandan | |
| 7,692,199 B2 | 4/2010 | Arai | |
| 7,722,965 B2 * | 5/2010 | Juni et al. | 428/690 |
| 7,755,097 B2 | 7/2010 | Kim | |
| 7,859,627 B2 | 12/2010 | Nishida et al. | |
| 7,956,349 B2 | 6/2011 | Tsutsui et al. | |
| 8,003,993 B2 | 8/2011 | Cho et al. | |
| 8,004,003 B2 | 8/2011 | Kim | |
| 8,042,975 B2 | 10/2011 | Shyu et al. | |
| 8,496,341 B2 | 7/2013 | Kawata et al. | |
| 8,686,630 B2 | 4/2014 | Hiyama et al. | |
| 8,853,724 B2 | 10/2014 | Seo et al. | |
| 2001/0035713 A1 | 11/2001 | Kimura | |
| 2001/0053082 A1 | 12/2001 | Chipalkatti et al. | |
| 2003/0007359 A1 * | 1/2003 | Sugawara et al. | 362/326 |
| 2004/0217702 A1 | 11/2004 | Garner et al. | |
| 2005/0199599 A1 | 9/2005 | Li et al. | |
| 2005/0258436 A1 | 11/2005 | Arai | |
| 2006/0007552 A1 | 1/2006 | Takakuwa et al. | |
| 2006/0139953 A1 * | 6/2006 | Chou et al. | 362/613 |
| 2006/0237735 A1 | 10/2006 | Naulin et al. | |
| 2007/0222372 A1 | 9/2007 | Cok et al. | |
| 2008/0018231 A1 | 1/2008 | Hirakata | |
| 2008/0121918 A1 | 5/2008 | DenBaars et al. | |
| 2008/0129184 A1 | 6/2008 | Nishida et al. | |
| 2008/0129933 A1 | 6/2008 | Nishida et al. | |
| 2008/0130122 A1 | 6/2008 | Egi et al. | |
| 2008/0213931 A1 | 9/2008 | Asabe | |
| 2009/0162623 A1 * | 6/2009 | Foresti et al. | 428/210 |
| 2009/0267092 A1 | 10/2009 | Fukshima et al. | |
| 2010/0006882 A1 | 1/2010 | Arai | |
| 2010/0013372 A1 | 1/2010 | Oikawa et al. | |
| 2010/0019664 A1 | 1/2010 | Mishima | |
| 2010/0046236 A1 | 2/2010 | Nishiwaki | |
| 2010/0090234 A1 | 4/2010 | Cho et al. | |
| 2010/0110551 A1 | 5/2010 | Lamansky et al. | |
| 2010/0295443 A1 | 11/2010 | Roberts et al. | |
| 2011/0038028 A1 * | 2/2011 | Dharmatilleke | 359/290 |
| 2011/0134647 A1 | 6/2011 | Nishida et al. | |
| 2011/0147777 A1 | 6/2011 | Konno et al. | |
| 2011/0205468 A1 | 8/2011 | Hirakata et al. | |
| 2011/0210332 A1 | 9/2011 | Jintyou et al. | |
| 2012/0097982 A1 | 4/2012 | Wakimoto et al. | |
| 2012/0097991 A1 | 4/2012 | Ikeda et al. | |
| 2012/0099331 A1 | 4/2012 | Yamazaki et al. | |
| 2012/0204566 A1 * | 8/2012 | Hartzell et al. | 60/641.15 |

FOREIGN PATENT DOCUMENTS

| | | |
|---|---|---|
| JP | 2002-299039 A | 10/2002 |
| JP | 2005-332773 | 12/2005 |
| JP | 2007-173424 | 7/2007 |
| JP | 2008-010317 A | 1/2008 |
| JP | 2008-066027 A | 3/2008 |
| JP | 2008-098083 A | 4/2008 |
| TW | 201011349 | 3/2010 |
| WO | WO-2010/090207 | 8/2010 |

OTHER PUBLICATIONS

Taiwanese Office Action (Application No. 100141657) Dated Dec. 21, 2015.

* cited by examiner

LIGHTING DEVICE

BACKGROUND OF THE INVENTION

1. Field of the Invention

The present invention relates to a lighting device. In particular, the present invention relates to a lighting device having a plane light-emitting body as a light source.

2. Description of the Related Art

In recent years, lighting devices provided with light sources utilizing organic electroluminescence (hereinafter also referred to as "organic EL" have been actively developed. The light sources are plane light-emitting bodies and have low directivity of emitted light. In general, the refractive index of a light-emitting region in the light source is higher than that of the air. Thus, total reflection of part of light emitted from the light source occurs at the interface with the air. As a result, the proportion of light emitted to the outside (in the air) of light emitted from the light source (hereinafter also referred to as light extraction efficiency) might be decreased, which is a problem.

A structure is disclosed in which a structure body is provided over a surface of a light source in order to solve such a problem. For example, Non-Patent Document 1 discloses a structure in which a high refractive index glass substrate and a high refractive index lens are used in combination and a structure in which a concave-convex structure is provided at the interface between a high refractive index glass substrate and the air. With the structure, light extraction efficiency can be improved.

REFERENCE

[Non-Patent Document 1] *White organic light-emitting diodes with fluorescent tube efficiency*, Nature, May 14, 2009, Vol. 459, pp. 234-239

However, there are a few kinds of materials having a light-transmitting property and a high refractive index (e.g., glass or resin) in the structure disclosed in Non-Patent Document 1, and also, they are expensive. Accordingly, there occurs a problem that manufacturing cost of the lighting device increases in the case where the lighting device has the structure.

In view of the above problem, an object of one embodiment of the present invention is to provide a lighting device with high light extraction efficiency at low manufacturing cost.

SUMMARY OF THE INVENTION

A main point of one embodiment of the present invention is to improve light extraction efficiency in a lighting device using a small quantity of high refractive index material layer.

Specifically, one embodiment of the present invention is a lighting device including a structure body which has an inner surface including a region with a negative Fresnel lens shape and which has an outer surface with a concave-convex shape; a high refractive index material layer which is closely in contact with the inner surface of the structure body; and a plane light-emitting body which is provided over the structure body with the high refractive index material layer interposed therebetween. The structure body and the high refractive index material layer transmit light. The refractive index of the high refractive index material layer and the refractive index of a light-emitting region in the plane light-emitting body are higher than the refractive index of the structure body by 0.1 or more ($n_A \geq n_C + 0.1$ and $n_B \geq n_C + 0.1$ are satisfied assuming that the refractive index of the high refractive index material layer is $n_A$, the refractive index of the light-emitting region in the plane light-emitting body is $n_B$, and the refractive index of the structure body is $n_C$).

Note that in the above structure, the refractive index of the high refractive index material layer is preferably higher than or equal to the value which is 0.1 lower than the refractive index of the light-emitting region in the plane light-emitting body ($n_A \geq n_B - 0.1$). Further, the refractive index of the high refractive index material layer is preferably higher than or equal to the refractive index of the light-emitting region in the plane light-emitting body ($n_A \geq n_B$).

Note that when the refractive index of the high refractive index material layer is much higher than the refractive index of the light-emitting region in the plane light-emitting body, an influence of reflection at the interface with the high refractive index material layer due to a difference between refractive indices is significant. Thus, in the above structure, the refractive index of the high refractive index material layer is preferably lower than or equal to the value which is 0.1 higher than the refractive index of the light-emitting region in the plane light-emitting body ($n_B + 0.1 \geq n_A$).

According to the above description, in the above structure, the refractive index of the high refractive index material layer is preferably higher than or equal to the value which is 0.1 lower than the refractive index of the light-emitting region in the plane light-emitting body and lower than or equal to the value which is 0.1 higher than the refractive index of the light-emitting region in the plane light-emitting body ($n_B + 0.1 \geq n_A \geq n_B - 0.1$). Further, the refractive index of the high refractive index material layer is preferably higher than or equal to the refractive index of the light-emitting region in the plane light-emitting body and lower than or equal to the value which is 0.1 higher than the refractive index of the light-emitting region in the plane light-emitting body ($n_B + 0.1 \geq n_A \geq n_B$).

A lighting device according to one embodiment of the present invention includes a structure body which has an inner surface including a region with a negative Fresnel lens shape and a high refractive index material layer which is closely in contact with the inner surface. Note that the high refractive index material layer has a Fresnel lens shape in a region closely in contact with the inner surface. Thus, it is possible to improve light extraction efficiency of a plane light-emitting body provided over the structure body with the high refractive index material layer interposed therebetween. The high refractive index material layer is provided so as to fill at least the negative Fresnel lens shape of the structure body and thus has a surface including the region with a Fresnel lens shape at the interface with the structure body. Therefore, in the case of the lighting device, the usage of the high refractive index material layer can be reduced. Thus, it is possible to provide a lighting device with high light extraction efficiency at low manufacturing cost.

DETAILED DESCRIPTION OF THE INVENTION

Hereinafter, embodiments and examples of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be construed as being limited to the descriptions of the embodiments and the examples below.

Structure Example of Lighting Device

Figure 1:
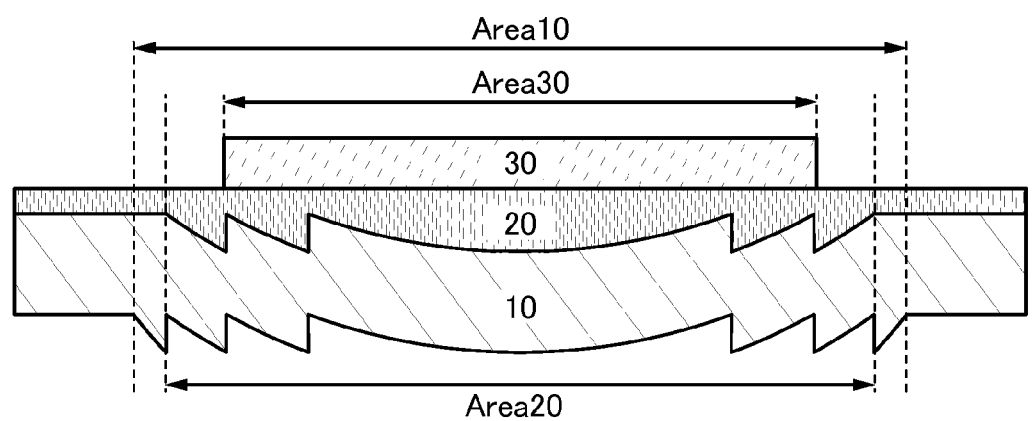
FIG. 1 illustrates a structure example of a lighting device.

FIG. 1 illustrates a structure example of a lighting device according to one embodiment of the present invention. The lighting device in FIG. 1 includes a structure body 10 which has a light-transmitting property, a high refractive index material layer 20 which has a light-transmitting property and is provided over the structure body 10, and a plane light-emitting body 30 which can perform plane light emission and is provided over the high refractive index material layer 20. The refractive index of the high refractive index material layer 20 and the refractive index of a light-emitting region included in the plane light-emitting body 30 are higher than the refractive index of the structure body 10 by 0.1 or more ($n_A \geq n_C+0.1$ and $n_B \geq n_C+0.1$ are satisfied assuming that the refractive index of the high refractive index material layer is $n_A$, the refractive index of the light-emitting region included in the plane light-emitting body is $n_B$, and the refractive index of the structure body is $n_C$). Note that the lighting device in FIG. 1 emits light from the plane light-emitting body 30 toward the outside through the high refractive index material layer 20 and the structure body 10.

Note that in the lighting device in FIG. 1, the refractive index of the high refractive index material layer 20 is preferably higher than or equal to the value which is 0.1 lower than the refractive index of the light-emitting region in the plane light-emitting body 30 ($n_A \geq n_B-0.1$). Further, the refractive index of the high refractive index material layer 20 is preferably higher than or equal to the refractive index of the light-emitting region in the plane light-emitting body 30 ($n_A \geq n_B$).

Note that when the refractive index of the high refractive index material layer 20 is much higher than the refractive index of the light-emitting region in the plane light-emitting body 30, an influence of reflection at the interface with the high refractive index material layer 20 due to a difference between refractive indices is significant. Thus, in the lighting device in FIG. 1, the refractive index of the high refractive index material layer 20 is preferably lower than or equal to the value which is 0.1 higher than the refractive index of the light-emitting region in the plane light-emitting body 30 ($n_B+0.1 \geq n_A$).

According to the above description, in the lighting device in FIG. 1, the refractive index of the high refractive index material layer 20 is preferably higher than or equal to the value which is 0.1 lower than the refractive index of the light-emitting region in the plane light-emitting body 30 and lower than or equal to the value which is 0.1 higher than the refractive index of the light-emitting region in the plane light-emitting body 30 ($n_B+0.1 \geq n_A \geq n_B-0.1$). Further, the refractive index of the high refractive index material layer 20 is preferably higher than or equal to the refractive index of the light-emitting region in the plane light-emitting body 30 and lower than or equal to the value which is 0.1 higher than the refractive index of the light-emitting region in the plane light-emitting body 30 ($n_B+0.1 \geq n_A \geq n_B$).

The structure body 10 has an inner surface (a first surface) including a region with a negative Fresnel lens shape and an outer surface (a second surface opposite to the first surface) including a region with a Fresnel lens shape. The high refractive index material layer 20 is provided so as to fill at least the region with a negative Fresnel lens shape of the inner surface of the structure body 10. Thus, the high refractive index material layer 20 includes a region with a Fresnel lens shape at the interface with the structure body 10. Note that the shape of the surface of the high refractive index material layer 20, which is on the plane light-emitting body 30 side, is not limited to a specific shape. However, the surface is preferably plane or substantially plane because the plane light-emitting body 30 is provided over the surface.

Note that the outer surface of the structure body 10 is not necessarily a surface including a region with a Fresnel lens shape. For example, the outer surface can be a surface including a region with any of various convex-concave shapes, such as a surface including a region with a micro lens array shape. On the other hand, the inner surface of the structure body 10 preferably includes a region with a negative Fresnel lens shape. For example, when the inner surface includes a region with a micro lens array shape, the size of each micro lens formed of the high refractive index material layer 20 is smaller than that of the plane light-emitting body 30. Therefore, part of light emitted from the plane light-emitting body 30 may be reflected by the micro lens, and light extraction efficiency may be lowered.

Further, it is preferable that the region with a Fresnel lens shape of the high refractive index material layer 20 (Area 20) be larger than the light-emitting region in the plane light-emitting body 30 (a region included in Area 30) as illustrated in FIG. 1. In such a case, the light extraction efficiency of the plane light-emitting body 30 can be improved. For a similar reason, the region with a Fresnel lens shape of the structure body 10 (Area 10) is preferably larger than the region with a Fresnel lens shape of the high refractive index material layer 20 (Area 20).

The lighting device in FIG. 1 includes the high refractive index material layer 20 having a surface including a region with a Fresnel lens shape. Thus, it is possible to improve light extraction efficiency of the plane light-emitting body 30 provided over the structure body 10 with the high refractive index material layer 20 interposed therebetween. The surface with a Fresnel lens shape of the high refractive index material layer 20 is formed so as to fill a negative Fresnel lens shape of the structure body 10. Therefore, in the case of the lighting device, the usage of the high refractive index material layer can be reduced. Thus, it is possible to provide a lighting device with high light extraction efficiency at low manufacturing cost.

SPECIFIC EXAMPLES

Next, description will be given to specific examples of components of the lighting device in FIG. 1.

Specific Example of Structure Body 10

For the structure body 10, glass, resin, or the like can be used. As the resin, a polyester resin, a polyacrylonitrile resin, a polyimide resin, a polymethyl methacrylate resin, a poly-carbonate resin, a polyethersulfone resin, a polyamide resin, a cycloolefin resin, a polystyrene resin, a polyamide imide resin, a polyvinylchloride resin, or the like can be used. The kinds of such materials are various, which means that the materials are available at low cost and that the degree of freedom for selecting a material is high. Owing to the high degree of freedom for selecting a material, the degree of freedom for selecting a manufacturing method is also high.

As a method for forming shapes of the inner surface and the outer surface of the structure body 10, a method using a mold can be employed. In particular, when integral molding is performed using one material by an injection molding method or the like, a difference is not likely to occur between the refractive indices of structures, which leads to suppression of generation of stray light. Thus, it is possible to improve the light extraction efficiency of the plane light-emitting body 30. As a method for forming shapes of the inner surface and the outer surface of the structure body 10, an etching method, a sand blasting method, a microblast processing method, a droplet discharge method, a printing method (screen printing or offset printing by which a pattern is formed), a coating method such as a spin coating method, a dipping method, a dispenser method, an imprint method, a nanoimprint method, or the like may alternatively be employed.

The structure body 10 may have a single-layer structure or a layered structure of a plurality of layers. For example, an inorganic material film having a light-transmitting property and a barrier property is preferably provided at the interface with the high refractive index material layer 20. As the inorganic material film, a silicon oxide film or a silicon oxynitride film can be used. The inorganic material film can prevent diffusion of an impurity to the plane light-emitting body 30 without a decrease in light extraction efficiency. For example, when the plane light-emitting body 30 emits light utilizing organic EL, entry of an impurity such as moisture into the plane light-emitting body 30 can be suppressed, resulting in improvement in reliability of the lighting device.

Figure 2A:
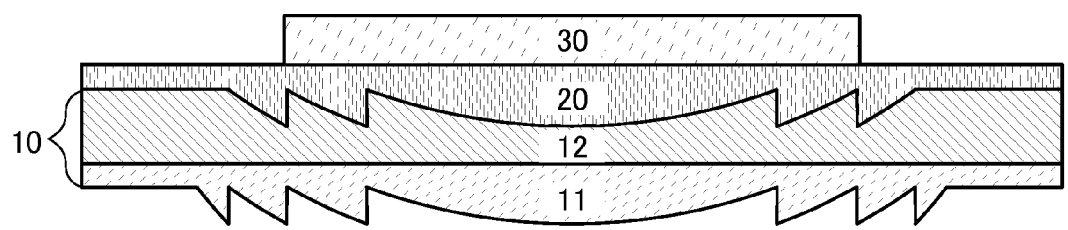
FIGS. 2A and 2B illustrate structure examples of lighting devices.
Figure 2B:
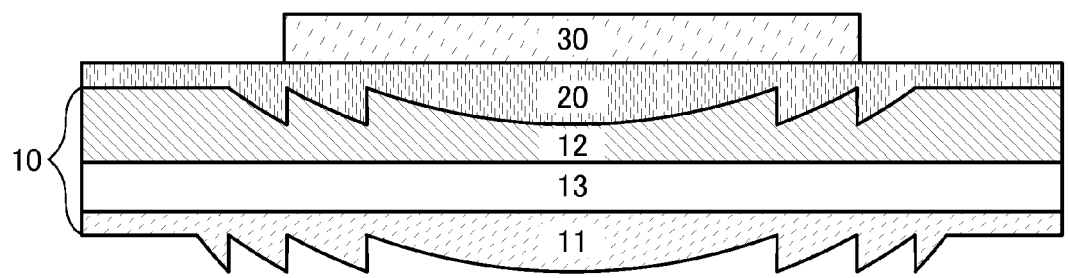

The structure body 10 may be formed by combining a plurality of members. For example, the structure body may be formed of a member 11 having a surface including a region with a Fresnel lens shape and a member 12 having a surface including a region with a negative Fresnel lens shape as in FIG. 2A. Alternatively, the structure body may be formed of the member 11 having a surface including a region with a Fresnel lens shape, the member 12 having a surface including a region with a negative Fresnel lens shape, and a member 13 provided between the member 11 and the member 12 as in FIG. 2B. When the structure body 10 has a structure where a plurality of members are attached to each other, the refractive indices of the members and an adhesive are preferably substantially equal (a difference between the refractive indices is less than 0.1). In such a case, a difference between the refractive indices of the inside of the structure body 10 can be reduced. As a result, stray light can be reduced, and thus extraction efficiency of light emitted from the plane light-emitting body 30 can be improved.

Specific Example of High Refractive Index Material Layer 20

For the high refractive index material layer 20, glass, resin, or the like with a high refractive index can be used. As the resin with a high refractive index, a resin containing bromine, a resin containing sulfur, and the like can be given. Specifically, a polyimide resin containing sulfur, an episulfide resin, a thiourethane resin, a brominated aromatic resin, or the like can be used. Further, polyethylene terephthalate (PET), triacetyl cellulose (TAC), or the like can be used.

As a method for forming the high refractive index material layer 20, an appropriate method suitable to a material may be selected from various methods in consideration of adhesive strength, processibility, and the like. For example, the high refractive index material layer 20 can be formed in such a manner that the resin or the like is deposited by a spin coating method or a screen printing method and cured by heat or light.

The high refractive index material layer 20 may have a single-layer structure or a layered structure of a plurality of layers. Here, when the high refractive index material layer 20 includes a stack of a plurality of layers, the stack preferably includes an inorganic material film (in particular, a nitride film). For example, as the inorganic material film, a silicon nitride film, an aluminum nitride film, a silicon nitride oxide film, an aluminum oxide film, or the like can be used. The inorganic material film can prevent diffusion of an impurity to the plane light-emitting body 30 without a decrease in light extraction efficiency. For example, when the plane light-emitting body 30 emits light utilizing organic EL, entry of an impurity such as moisture into the plane light-emitting body 30 can be suppressed, resulting in improvement in reliability of the lighting device.

Specific Example of Plane Light-Emitting Body 30

The plane light-emitting body 30 can be provided with a light source utilizing organic EL. The light source includes a first electrode, a second electrode, and an organic layer containing a light-emitting substance. One of the first electrode and the second electrode serves as an anode and the other serves as a cathode. The organic layer containing a light-emitting substance is provided between the first electrode and the second electrode, and the structure of the organic layer may be determined as appropriate depending on the polarities and materials of the first electrode and the second electrode. Although an example of the structure of the light source will be described below, it is needless to say that the structure of the plane light-emitting body 30 is not limited to the example.

Structure Example 1 of Light Source

Figure 3A:
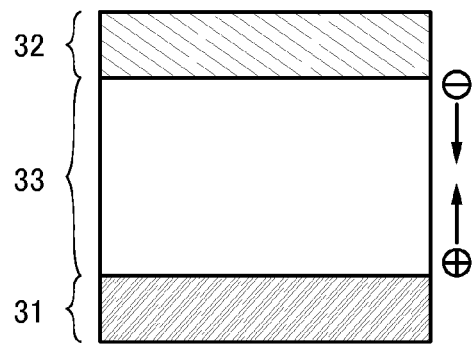
FIGS. 3A to 3C illustrate structure examples of light sources.

FIG. 3A illustrates a structure example of a light source. In the light source in FIG. 3A, an organic layer 33 containing a light-emitting substance is provided between an anode 31 and a cathode 32.

When a voltage higher than the threshold voltage is applied between the anode 31 and the cathode 32, holes are injected into the organic layer 33 containing a light-emitting substance from the anode 31 side, and electrons are injected into the organic layer 33 containing a light-emitting substance from the cathode 32 side. The injected electrons and the injected holes are recombined in the organic layer 33 containing a light-emitting substance, so that the light-emitting substance emits light.

The organic layer 33 containing a light-emitting substance needs to include at least a light-emitting layer containing a light-emitting substance, and may have a structure in which a layer other than the light-emitting layer and the light-emitting layer are stacked. Examples of the layer other than the light-emitting layer are layers containing a substance having a high hole-injection property, a substance having a high hole-transport property, a substance having a high electron-transport property, a substance having a high electron-injection property, and a substance having a bipolar property (a substance having high electron-and-hole-transport properties). Specifically, a hole-injection layer, a hole-transport layer, a light-emitting layer, a hole-blocking layer, an electron-transport layer, an electron-injection layer, and the like are given, and they can be combined as appropriate and stacked from the anode 31 side.

Structure Example 2 of Light Source

Figure 3B:
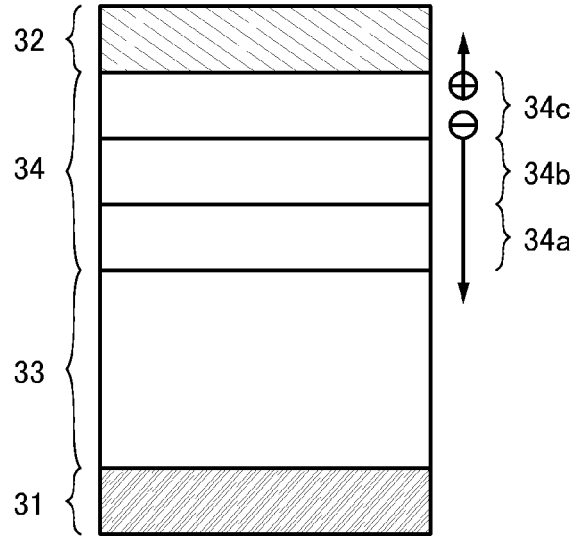

FIG. 3B illustrates a structure example of a light source having a structure different from that of the light source in FIG. 3A. In the light source in FIG. 3B, the organic layer 33 containing a light-emitting substance is provided between the anode 31 and the cathode 32. Further, an intermediate layer 34 is provided between the cathode 32 and the organic layer 33 containing a light-emitting substance. Note that a structure similar to that in the above structure example 1 of the light source can be applied to the organic layer 33 containing a light-emitting substance in the structure example 2 of the light source, and for the details, the structure example 1 of the light source can be referred to.

The intermediate layer 34 needs to include at least a charge generation region, and may have a structure in which the charge generation region and a layer other than the charge generation region are stacked. For example, a structure can be employed in which a charge generation region 34c, an electron-relay layer 34b, and an electron-injection buffer 34a are stacked in this order from the cathode 32 side.

The behaviors of electrons and holes in the intermediate layer 34 will be described. When a voltage higher than the threshold voltage is applied between the anode 31 and the cathode 32, in the charge generation region 34c, holes and electrons are generated, and the holes move into the cathode 32 and the electrons move into the electron-relay layer 34b. The electron-relay layer 34b has a high electron-transport property and immediately transfers the electrons generated in the charge generation region 34c to the electron-injection buffer 34a. The electron-injection buffer 34a can reduce a barrier in injection of electrons into the organic layer 33 containing a light-emitting substance, and the efficiency of the electron injection into the organic layer 33 containing a light-emitting substance can be improved. Thus, the electrons generated in the charge generation region 34c are injected into the LUMO level of the organic layer 33 containing a light-emitting substance through the electron-relay layer 34b and the electron-injection buffer 34a.

In addition, the electron-relay layer 34b can prevent interaction in which a substance contained in the charge generation region 34c and a substance contained in the electron-injection buffer 34a react with each other at the interface thereof and the functions of the charge generation region 34c and the electron-injection buffer 34a are damaged.

Structure Example 3 of Light Source

Figure 3C:
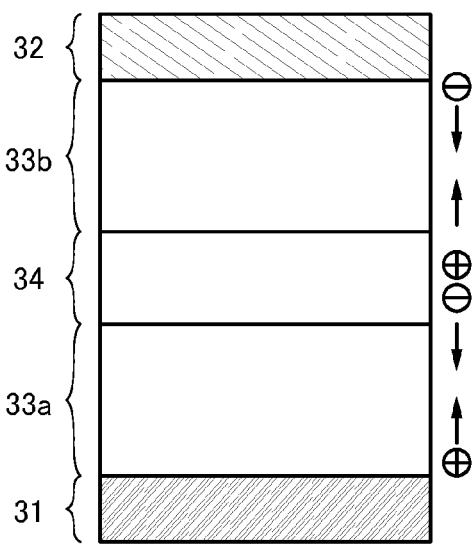

FIG. 3C illustrates a structure example of a light source having a structure different from those of the light sources in FIGS. 3A and 3B. In the light source in FIG. 3C, organic layers 33a and 33b each containing a light-emitting substance are provided between the anode 31 and the cathode 32. Further, the intermediate layer 34 is provided between the organic layer 33a containing a light-emitting substance and the organic layer 33b containing a light-emitting substance. Note that the number of the organic layers each containing a light-emitting substance which are interposed between the anode 31 and the cathode 32 is not limited to two. That is, a structure may be employed in which three or more organic layers each containing a light-emitting substance are stacked between the anode 31 and the cathode 32, with an intermediate layer interposed between the organic layers each containing a light-emitting substance. Note that a structure similar to that in the above structure example 1 of the light source can be applied to the organic layers 33a and 33b each containing a light-emitting substance in the structure example 3 of the light source, and a structure similar to that in the above structure example 2 of the light source can be applied to the intermediate layer 34 in the structure example 3 of the light source. Thus, for the details, the structure example 1 of the light source and the structure example 2 of the light source can be referred to.

The behaviors of electrons and holes in the intermediate layer 34 provided between the organic layers each containing a light-emitting substance will be described. When a voltage higher than the threshold voltage is applied between the anode 31 and the cathode 32, in the intermediate layer 34, holes and electrons are generated, and the holes move into the organic layer 33b containing a light-emitting substance which is provided on the cathode 32 side and the electrons move into the organic layer 33a containing a light-emitting substance which is provided on the anode 31 side. The holes injected into the organic layer 33b containing a light-emitting substance are recombined with the electrons injected from the cathode 32 side, so that the light-emitting substance emits light. The electrons injected into the organic layer 33a containing a light-emitting substance are recombined with the holes injected from the anode 31 side, so that the light-emitting substance emits light. Thus, the holes and electrons generated in the intermediate layer 34 cause light emission in the respective organic layers each containing a light-emitting substance.

Note that in the case where a structure which is the same as an intermediate layer is formed between the organic layers each containing a light-emitting substance by providing the organic layers each containing a light-emitting substance that are in contact with each other, the organic layers each containing a light-emitting substance can be formed to be in contact with each other. Specifically, when a charge generation region is formed on one surface of the organic layer containing a light-emitting substance, the charge generation region functions as a charge generation region of an intermediate layer; thus, the organic layers each containing a light-emitting substance can be formed in contact with each other.

The structure examples 1 to 3 of the light source can be implemented in combination. For example, an intermediate layer may be provided between the cathode 32 and the organic layer 33b containing a light-emitting substance in the structure example 3 of the light source.

<Material for Light Source>

Next, specific materials that can be used for the light source having the above structure will be described. Materials for the anode 31, the cathode 32, the organic layer 33 containing a light-emitting substance, the charge generation region 34c, the electron-relay layer 34b, and the electron-injection buffer 34a will be described in this order.

<Material for Anode 31>

The anode 31 is preferably formed using a metal, an alloy, an electrically conductive compound, a mixture thereof, or the like which has a high work function (specifically, a work function of 4.0 eV or higher is preferable). Specific examples are indium oxide-tin oxide (indium tin oxide: ITO), indium oxide-tin oxide containing silicon or silicon oxide, indium oxide-zinc oxide (indium zinc oxide: IZO), and indium oxide containing tungsten oxide and zinc oxide.

Such conductive metal oxide films are usually formed by a sputtering method, but may be formed by application of a sol-gel method or the like. For example, an indium oxide-zinc oxide (IZO) film can be formed by a sputtering method using a target in which zinc oxide is added to indium oxide at 1 wt % to 20 wt %. A film of indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively.

Besides, as a material used for the anode 31, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), a nitride of a metal material (e.g., titanium nitride), molybdenum oxide, vanadium oxide, ruthenium oxide, tungsten oxide, manganese oxide, titanium oxide, and the like. Alternatively, a conductive polymer such as poly(3,4-ethylenedioxythiophene)/poly(styrenesulfonic acid) (PEDOT/PSS) or polyaniline/poly(styrenesulfonic acid) (PAni/PSS) may be used.

Note that in the case where the charge generation region is provided in contact with the anode 31, a variety of conductive materials can be used for the anode 31 regardless of their work functions. Specifically, besides a material which has a high work function, a material which has a low work function can be used for the anode 31.

<Material for Cathode 32>

In the case where the charge generation region is provided between the cathode 32 and the organic layer 33 containing a light-emitting substance so as to be in contact with the cathode 32, a variety of conductive materials can be used for the cathode 32 regardless of their work functions.

Note that at least one of the cathode 32 and the anode 31 is formed using a conductive film having a light-transmitting property. For the conductive film having a light-transmitting property, for example, indium oxide containing tungsten oxide, indium zinc oxide containing tungsten oxide, indium oxide containing titanium oxide, indium tin oxide containing titanium oxide, indium tin oxide, indium zinc oxide, and indium tin oxide to which silicon oxide is added can be given. Alternatively, a metal thin film having a thickness enough to transmit light (preferably, approximately 5 nm to 30 nm) may be used.

<Material for Organic Layer 33 Containing Light-Emitting Substance>

Specific examples of the materials for the layers included in the above organic layer 33 containing a light-emitting substance will be described below.

The hole-injection layer is a layer containing a substance having a high hole-injection property. As the substance having a high hole-injection property, for example, molybdenum oxide, vanadium oxide, ruthenium oxide, tungsten oxide, or manganese oxide can be used. Besides, it is possible to use a phthalocyanine-based compound such as phthalocyanine (abbreviation: $H_2Pc$) or copper phthalocyanine (abbreviation: CuPc), a macromolecule such as poly (3,4-ethylenedioxythiophene)/poly(styrenesulfonate) (PEDOT/PSS), or the like to form the hole-injection layer.

Note that the hole-injection layer may be formed using the charge generation region. When the charge generation region is used for the hole-injection layer, a variety of conductive materials can be used for the anode 31 regardless of their work functions as described above.

The hole-transport layer is a layer containing a substance having a high hole-transport property. As the substance having a high hole-transport property, the following can be given, for example: aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BPAFLP), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenyl-carbazol-3-yl)amino]-9-phenylcarbazole (abbreviation: PCzPCN1); and the like. Alternatively, the following can be used: a carbazole derivative such as 4,4'-di(N-carbazolyl) biphenyl (abbreviation: CBP), 1,3,5-tris[4-(N-carbazolyl) phenyl]benzene (abbreviation: TCPB), or 9-[4-(10-phenyl-9-anthryl)phenyl]-9H-carbazole (abbreviation: CzPA), or the like. The substances mentioned here are mainly substances having a hole mobility of $10^{-6}$ $cm^2/Vs$ or higher. However, substances other than those may be used as long as the substances have hole-transport properties higher than electron-transport properties. The layer containing a substance having a high hole-transport property is not limited to a single layer, and a stack of two or more layers containing the above substances may be used.

Besides, a macromolecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), or poly[N,N'-bis(4-butylphenyl)-N,N'-bis(phenyl)benzidine] (abbreviation: Poly-TPD) can be used for the hole-transport layer.

The light-emitting layer contains a light-emitting substance. As the light-emitting substance, any of the following fluorescent compounds can be used. For example, the following can be given: N,N'-bis[4-(9H-carbazol-9-yl)phenyl]-N,N'-diphenylstilbene-4,4'-diamine (abbreviation: YGA2S); 4-(9H-carbazol-9-yl)-4'-(10-phenyl-9-anthryl)triphenylamine (abbreviation: YGAPA); 4-(9H-carbazol-9-yl)-4'-(9,10-diphenyl-2-anthryl)triphenylamine (abbreviation: 2YGAPPA); N,9-diphenyl-N-[4-(10-phenyl-9-anthryl)phenyl]-9H-carbazol-3-amine (abbreviation: PCAPA); perylene; 2,5,8,11-tetra-tert-butylperylene (abbreviation: TBP); 4-(10-phenyl-9-anthryl)-4'-(9-phenyl-9H-carbazol-3-yl)triphenylamine (abbreviation: PCBAPA); N,N"-(2-tert-butylanthracene-9,10-diyldi-4,1-phenylene)bis[N,N',N'-triphenyl-1,4-phenylenediamine] (abbreviation: DPABPA); N,9-diphenyl-N-[4-(9,10-diphenyl-2-anthryl)phenyl]-9H-carbazol-3-amine (abbreviation: 2PCAPPA); N-[4-(9,10-diphenyl-2-anthryl)phenyl]-N,N',N'-triphenyl-1,4-phenylenediamine (abbreviation: 2DPAPPA); N,N,N',N',N",N",N"',N"'-octaphenyldibenzo[g,p]chrysene-2,7,10,15-tetraamine (abbreviation: DBC1); coumarin 30; N-(9,10-diphenyl-2-anthryl)-N,9-diphenyl-9H-carbazol-3-amine (abbreviation: 2PCAPA); N-[9,10-bis(1,1'-biphenyl-2-yl)-2-anthryl]-N,9-diphenyl-9H-carbazol-3-amine (abbreviation: 2PCABPhA); N-(9,10-diphenyl-2-anthryl)-N,N',N'-triphenyl-1,4-phenylenediamine (abbreviation: 2DPAPA); N-[9,10-bis(1,1'-biphenyl-2-yl)-2-anthryl]-N,N',N'-triphenyl-1,4-phenylenediamine (abbreviation: 2DPABPhA); 9,10-bis(1,1'-biphenyl-2-yl)-N-[4-(9H-carbazol-9-yl)phenyl]-N- phenylanthracen-2-amine (abbreviation: 2YGABPhA); N,N,9-triphenylanthracen-9-amine (abbreviation: DPhAPhA); coumarin 545T; N,N'-diphenylquinacridone (abbreviation: DPQd); rubrene; 5,12-bis(1,1'-biphenyl-4-yl)-6,11-diphenyltetracene (abbreviation: BPT); 2-(2-{2-[4-(dimethylamino)phenyl]ethenyl}-6-methyl-4H-pyran-4-ylidene)propanedinitrile (abbreviation: DCM1); 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2); N,N,N',N'-tetrakis(4-methylphenyl)tetracene-5,11-diamine (abbreviation: p-mPhTD); 7,14-diphenyl-N,N,N',N'-tetrakis(4-methylphenyl)acenaphtho[1,2-a]fluoranthene-3,10-diamine (abbreviation: p-mPhAFD); 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI); 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB); 2-(2,6-bis{2-[4-(dimethylamino)phenyl]ethenyl}-4H-pyran-4-ylidene)propanedinitrile (abbreviation: BisDCM); 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM); and SD1 (product name; manufactured by SFC Co., Ltd.).

As the light-emitting substance, any of the following phosphorescent compounds may be used. The following can be given, for example: bis[2-(4',6'-difluorophenyl)pyridinato-N,$C^{2'}$]iridium(III) tetrakis(1-pyrazolyl)borate (abbreviation: FIr6); bis[2-(4',6'-difluorophenyl)pyridinato-N,$C^{2'}$] iridium(III) picolinate (abbreviation: FIrpic); bis[2-(3',5'-bistrifluoromethylphenyl)pyridinato-N,$C^{2'}$]iridium(III) picolinate (abbreviation: Ir($CF_3$ ppy)$_2$(pic)); bis[2-(4',6'-difluorophenyl)pyridinato-N,$C^{2'}$]iridium(III) acetylacetonate (abbreviation: FIracac); tris(2-phenylpyridinato)iridium(III) (abbreviation: Ir(ppy)$_3$); bis(2-phenylpyridinato)iridium(III) acetylacetonate (abbreviation: Ir(ppy)$_2$(acac)); bis(benzo[ij]quinolinato)iridium(III) acetylacetonate (abbreviation: Ir(bzq)$_2$(acac)); bis(2,4-diphenyl-1,3-oxazolato-N,$C^{2'}$) iridium(III) acetylacetonate (abbreviation: Ir(dpo)$_2$(acac)); bis[2-(4'-perfluorophenylphenyl)pyridinato]iridium(III) acetylacetonate (abbreviation: Ir(p-PF-ph)$_2$(acac)); bis(2-phenylbenzothiazolato-N,$C^{2'}$)iridium(III) acetylacetonate (abbreviation: Ir(bt)$_2$(acac)); bis[2-(2'-benzo[4,5-α]thienyl)pyridinato-N,$C^{3'}$]iridium(III) acetylacetonate (abbreviation: Ir(btp)$_2$(acac)); bis(1-phenylisoquinolinato-N,$C^{2'}$)iridium(III) acetylacetonate (abbreviation: Ir(piq)$_2$(acac)); (acetylacetonato)bis[2,3-bis(4-fluorophenyl)quinoxalinato]iridium(III) (abbreviation: Ir(Fdpq)$_2$(acac)); (acetylacetonato)bis(2,3,5-triphenylpyrazinato)iridium(III) (abbreviation: Ir(tppr)$_2$(acac)); 2,3,7,8,12,13,17,18-octaethyl-21H,23H-porphyrin platinum(II) (abbreviation: PtOEP); tris(acetylacetonato) (monophenanthroline)terbium (III) (abbreviation: Tb(acac)$_3$(Phen)); tris(1,3-diphenyl-1,3-propanedionato) (monophenanthroline)europium(III) (abbreviation: Eu(DBM)$_3$(Phen)); tris[1-(2-thenoyl)-3,3,3-trifluoroacetonato](monophenanthroline)europium(III) (abbreviation: Eu(TTA)$_3$(Phen)); and (dipivaloylmethanato) bis(2,3,5-triphenylpyrazinato)iridium(III) (abbreviation: Ir(tppr)$_2$(dpm)).

Note that those light-emitting substances are preferably dispersed in a host material. As the host material, for example, the following can be used: an aromatic amine compound such as NPB (abbreviation), TPD (abbreviation), TCTA (abbreviation), TDATA (abbreviation), MTDATA (abbreviation), or BSPB (abbreviation); a carbazole derivative such as PCzPCA1 (abbreviation), PCzPCA2 (abbreviation), PCzPCN1 (abbreviation), CBP (abbreviation), TCPB (abbreviation), CzPA (abbreviation), 9-phenyl-3-[4-(10-phenyl-9-anthryl)phenyl]-9H-carbazole (abbreviation: PCzPA), or 4-phenyl-4'-(9-phenyl-9H-carbazol-3-yl)triphenylamine (abbreviation: PCBA1BP); a substance having a high hole-transport property which contains a macromolecular compound, such as PVK (abbreviation), PVTPA (abbreviation), PTPDMA (abbreviation), or Poly-TPD (abbreviation); a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato) beryllium (abbreviation: BeBq$_2$), or bis(2-methyl-8-quinolinolato) (4-phenylphenolato)aluminum (abbreviation: BAlq); a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$); or a substance having a high electron-transport property, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP).

The electron-transport layer contains a substance having a high electron-transport property. As the substance having a high electron-transport property, for example, a metal complex having a quinoline skeleton or a benzoquinoline skeleton, such as Alq (abbreviation), Almq$_3$ (abbreviation), BeBq$_2$ (abbreviation), or BAlq (abbreviation) can be used. Besides, a metal complex having an oxazole-based or thiazole-based ligand, such as Zn(BOX)$_2$ (abbreviation) or Zn(BTZ)$_2$ (abbreviation) may be used. Further, besides the metal complex, PBD (abbreviation), OXD-7 (abbreviation), CO11 (abbreviation), TAZ (abbreviation), BPhen (abbreviation), BCP (abbreviation), 2-[4-(dibenzothiophen-4-yl)phenyl]-1-phenyl-1H-benzimidazole (abbreviation: DBTBIm-II), or the like may be used. The substances mentioned here are mainly substances that have an electron mobility of $10^{-6}$ $cm^2$/Vs or higher. Note that substances other than those may be used as long as they have electron-transport properties higher than hole-transport properties. The electron-transport layer is not limited to a single layer, and a stack of two or more layers containing the above substances may be used.

Alternatively, a macromolecular compound may be used. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), or the like can be used.

The electron-injection layer contains a substance having a high electron-injection property. As the substance having a high electron-injection property, the following can be given: an alkali metal, an alkaline earth metal, and a compound thereof, such as lithium (Li), cesium (Cs), calcium (Ca), lithium fluoride (LiF), cesium fluoride (CsF), and calcium fluoride ($CaF_2$). Alternatively, a layer containing a substance having an electron-transport property and an alkali metal, an alkaline earth metal, or a compound thereof (e.g., Alq containing magnesium (Mg)) may be used. Such a structure makes it possible to improve the efficiency of electron injection from the cathode 32.

As a method for forming the organic layer 33 containing a light-emitting substance by combining these layers as appropriate, any of a variety of methods (e.g., a dry process and a wet process) can be selected as appropriate. For example, a vacuum evaporation method, an inkjet method, a spin coating method, or the like may be selected depending on a material to be used. Note that a different formation method may be employed for each layer.

<Material for Charge Generation Region 34c>

The charge generation region 34c contains a substance having a high hole-transport property and an acceptor substance. The charge generation region 34c is not limited to a structure in which a substance having a high hole-transport property and an acceptor substance are contained in the same film, and may have a structure in which a layer containing a substance having a high hole-transport property and a layer containing an acceptor substance are stacked. Note that in the case of a layered structure in which the charge generation region 34c is provided on the cathode 32 side, the layer containing the substance having a high hole-transport property is in contact with the cathode 32, and in the case of a layered structure in which the charge generation region 34c is provided on the anode 31 side, the layer containing the acceptor substance is in contact with the anode 31.

Note that the acceptor substance is preferably added to the charge generation region 34c so that the mass ratio of the acceptor substance to the substance having a high hole-transport property is greater than or equal to 0.1:1 and less than or equal to 4.0:1.

As the acceptor substance used for the charge generation region 34c, a transition metal oxide and an oxide of a metal belonging to any one of Groups 4 to 8 of the periodic table can be given. Specifically, molybdenum oxide is particularly preferable. Note that molybdenum oxide has a low hygroscopic property.

As the substance having a high hole-transport property which is used for the charge generation region 34c, any of a variety of organic compounds such as aromatic amine compounds, carbazole derivatives, aromatic hydrocarbons, and macromolecular compounds (such as oligomers, dendrimers, and polymers) can be used. Specifically, a substance having a hole mobility of $10^{-6}$ cm$^2$/Vs or higher is preferably used. Note that substances other than the above substances may be used as long as the substances have hole-transport properties higher than electron-transport properties.

<Material for Electron-Relay Layer 34b>

The electron-relay layer 34b is a layer that can immediately receive electrons drawn out by the acceptor substance in the charge generation region 34c. Therefore, the electron-relay layer 34b is a layer containing a substance having a high electron-transport property, and the LUMO level thereof is positioned between the acceptor level of the acceptor substance in the charge generation region 34c and the LUMO level of the organic layer 33 containing a light-emitting substance. Specifically, the LUMO level of the electron-relay layer 34b is preferably approximately greater than or equal to −5.0 eV and less than or equal to −3.0 eV.

As a substance used for the electron-relay layer 34b, for example, a perylene derivative and a nitrogen-containing condensed aromatic compound can be given. Note that a nitrogen-containing condensed aromatic compound is preferably used for the electron-relay layer 34b owing to its stability. Among nitrogen-containing condensed aromatic compounds, a compound having an electron-withdrawing group, such as a cyano group or a fluoro group, is preferably used because such a compound further facilitates reception of electrons in the electron-relay layer 34b.

As specific examples of the perylene derivative, the following can be given: 3,4,9,10-perylenetetracarboxylic dianhydride (abbreviation: PTCDA), 3,4,9,10-perylenetetracarboxylic bisbenzimidazole (abbreviation: PTCBI), N,N'-dioctyl-3,4,9,10-perylenetetracarboxylic diimide (abbreviation: PTCDI-C8H), and N,N'-dihexyl-3,4,9,10-perylenetetracarboxylic diimide (abbreviation: Hex PTC).

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), and 2,3-bis(4-fluorophenyl)pyrido[2,3-b]pyrazine (abbreviation: F2PYPR).

Besides, 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophen (abbreviation: DCMT), methanofullerenes (e.g., [6,6]-phenyl C$_{61}$ butyric acid methyl ester), or the like can be used for the electron-relay layer 34b.

<Material for Electron-Injection Buffer 34a>

The electron-injection buffer 34a is a layer which facilitates injection of electrons from the charge generation region 34c to the organic layer 33 containing a light-emitting substance. The provision of the electron-injection buffer 34a between the charge generation region 34c and the organic layer 33 containing a light-emitting substance makes it possible to reduce the injection barrier therebetween.

A substance having a high electron-injection property can be used for the electron-injection buffer 34a. For example, an alkali metal, an alkaline earth metal, a rare earth metal, or a compound thereof (e.g., an alkali metal compound (e.g., an oxide such as lithium oxide, a halide, or a carbonate such as lithium carbonate or cesium carbonate), an alkaline earth metal compound (e.g., an oxide, a halide, or a carbonate), or a rare earth metal compound (e.g., an oxide, a halide, or a carbonate)) can be used.

Further, in the case where the electron-injection buffer 34a contains a substance having a high electron-transport property and a donor substance, the donor substance is preferably added so that the mass ratio of the donor substance to the substance having a high electron-transport property is greater than or equal to 0.001:1 and less than or equal to 0.1:1. Note that as the donor substance, an alkali metal, an alkaline earth metal, a rare earth metal, a compound thereof (e.g., an alkali metal compound (e.g., an oxide such as lithium oxide, a halide, or a carbonate such as lithium carbonate or cesium carbonate), an alkaline earth metal compound (e.g., an oxide, a halide, or a carbonate), or a rare earth metal compound (e.g., an oxide, a halide, or a carbonate)), an organic compound such as tetrathianaphthacene (abbreviation: TTN), nickelocene, or decamethylnickelocene may be used. Note that as the substance having a high electron-transport property, a material similar to the above material for the electron-transport layer that can be formed in part of the organic layer 33 containing a light-emitting substance can be used.

A light source can be manufactured by combination of any of the above materials. Light emission from the above light-emitting substance can be obtained with this light source, and the emission color can be selected by changing the type of the light-emitting substance. Further, a plurality of light-emitting substances which emit light of different colors can be used, whereby, for example, white light emission can also be obtained by expanding the width of the emission spectrum. Note that in order to obtain white light emission, light-emitting substances whose emission colors are complementary may be used. Specific examples of complementary colors include "blue and yellow" and "blue-green and red".

Application Example

Figure 4A:
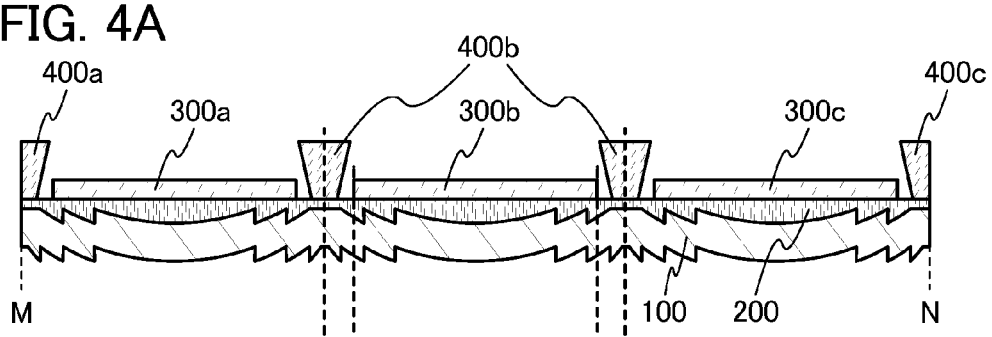
FIGS. 4A to 4C illustrate structure examples of lighting devices.
Figure 4B:
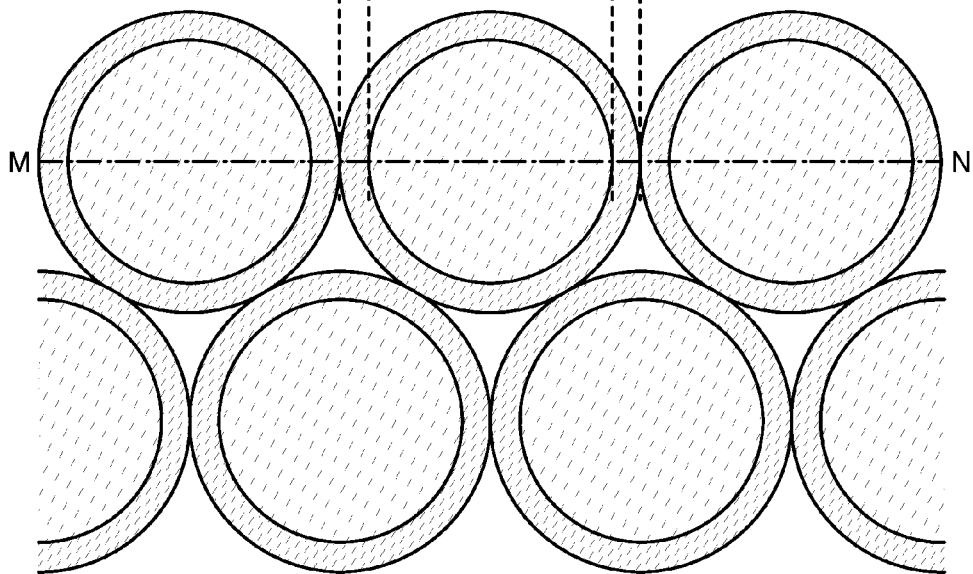
Figure 4C:
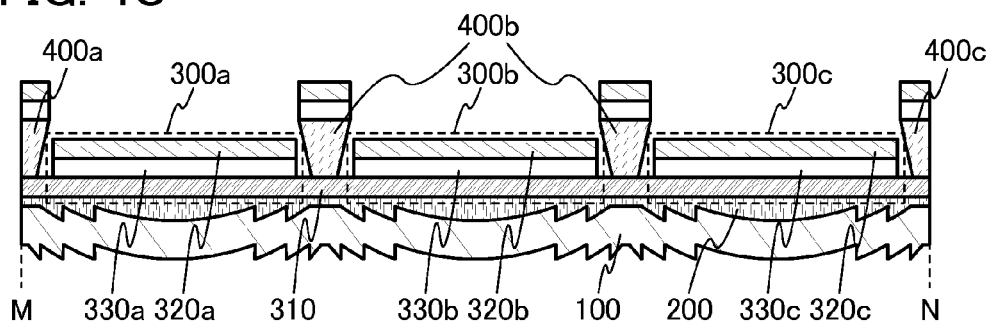

The lighting device disclosed in this specification can include only the components illustrated in FIG. 1, but may include a plurality of sets of the components in FIG. 1. Structure examples of the lighting device are illustrated in FIGS. 4A to 4C. FIG. 4A is a cross-sectional view of the lighting device and FIG. 4B is a top view thereof. Note that the cross-sectional view in FIG. 4A corresponds to the cross section along M-N in FIG. 4B.

The lighting device illustrated in FIGS. 4A and 4B includes a structure body 100, a high refractive index material layer 200, a plurality of plane light-emitting bodies 300a to 300c, and a plurality of partition walls 400a to 400c. The structure body 100 has the inner surface including a plurality of regions each with a negative Fresnel lens shape and the outer surface including a plurality of regions each with a Fresnel lens shape. The high refractive index material layer 200 is closely in contact with the inner surface of the structure body 100. The plurality of plane light-emitting bodies 300a to 300c are provided over the structure body 100 with the high refractive index material layer 200 provided therebetween. The plurality of partition walls 400a to 400c are provided respectively between the adjacent plane light-emitting bodies. In other words, the lighting device in FIGS. 4A and 4B emits light from the plurality of plane light-emitting bodies 300a to 300c separated by the plurality of partition walls 400a to 400c to the outside through the high refractive index material layer 200 and the structure body 100. In the lighting device, the light extraction efficiency of the plane light-emitting bodies 300a to 300c can be improved, which leads to improvement in luminous efficiency.

For specific description of the structure body, the high refractive index material layer, and the plane light-emitting body, the above description is referred to. The plurality of partition walls 400a to 400c can be formed using acrylic, siloxane, silicon oxide, or the like. Further, the plurality of partition walls 400a to 400c may be formed using either one of or both an inorganic film and an organic film.

Although the plurality of partition walls 400a to 400c in the lighting device in FIG. 4A have reverse tapered shapes, the partition walls may have forward tapered shapes.

Although the plurality of plane light-emitting bodies 300a to 300c and the plurality of partition walls 400a to 400c in the lighting device in FIG. 4B have circular shapes, the plane light-emitting bodies and the partition walls may have polygonal shapes or elliptical shapes.

When light sources using organic EL are used as the plane light-emitting bodies 300a to 300c, the lighting device may be formed as illustrated in FIG. 4C. Specifically, in the lighting device in FIG. 4C, the plane light-emitting bodies 300a to 300c include one of an anode and a cathode 310 provided over the structure body 100 with the high refractive index material layer 200 laid therebetween, a plurality of organic layers 330a to 330c containing light-emitting substances provided over the one of an anode and a cathode 310, and the other of the anode and the cathode 320a, the other of the anode and the cathode 320b, and the other of the anode and the cathode 320c provided over the plurality of organic layers 330a to 330c containing light-emitting substances, respectively. In addition, in the lighting device in FIG. 4C, the plurality of partition walls 400a to 400c are provided over the one of an anode and a cathode 310. Also over the plurality of partition walls 400a to 400c, the same layers as the organic layers 330a to 330c containing light-emitting substances and the same layers as the other of the anode and the cathode 320a, the other of the anode and the cathode 320b, and the other of the anode and the cathode 320c are provided respectively.

That is to say, the lighting device in FIG. 4C is manufactured in the following order. First, the one of an anode and a cathode 310 is formed over the high refractive index material layer 200. Then, the plurality of partition walls 400a to 400c are formed. After that, organic layers containing light-emitting substances are formed over the one of an anode and a cathode 310 and the plurality of partition walls 400a to 400c. At that time, disconnection of the organic layers is caused due to a difference in height between the one of an anode and a cathode 310 and the plurality of partition walls 400a to 400c. Accordingly, the plurality of organic layers 330a to 330c containing light-emitting substances, which are separated, over the one of an anode and a cathode 310 are formed, and separated organic layers containing light-emitting substances over the plurality of partition walls 400a to 400c are formed. Next, the other of the anode and the cathode is formed over the organic layer containing a light-emitting substance. At that time, disconnection of the other of the anode and the cathode is caused in a similar manner. Accordingly, the other of the anode and the cathode 320a, the other of the anode and the cathode 320b, and the other of the anode and the cathode 320c, which are separated, over the plurality of organic layers 330a to 330c containing light-emitting substances are formed, respectively, and the other of the anode and the cathode, the other of the anode and the cathode, and the other of the anode and the cathode, which are separated, over the plurality of partition walls 400a to 400c are formed, respectively, with the organic layers containing light-emitting substances interposed therebetween.

For specific description of the anode, the cathode, and the organic layers containing light-emitting substances, the above description is referred to.

EXAMPLE

In this example, examples of an electronic device provided with the lighting device according to one embodiment of the present invention will be described.

Figure 5A:
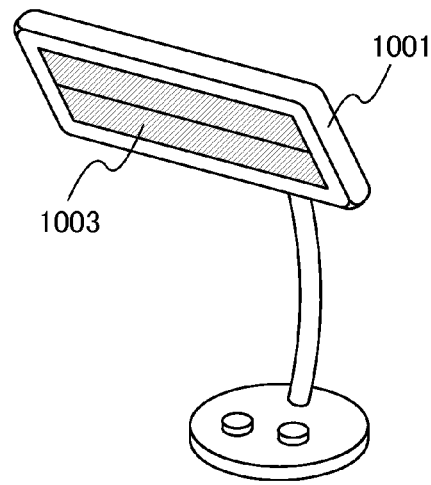
FIGS. 5A and 5B illustrate examples of electronic devices.

FIG. 5A illustrates an example in which the lighting device according to one embodiment of the present invention is used as a desk lamp. The desk lamp includes a housing 1001 and a lighting portion 1003. The lighting device according to one embodiment of the present invention is used as the lighting portion 1003.

Figure 5B:
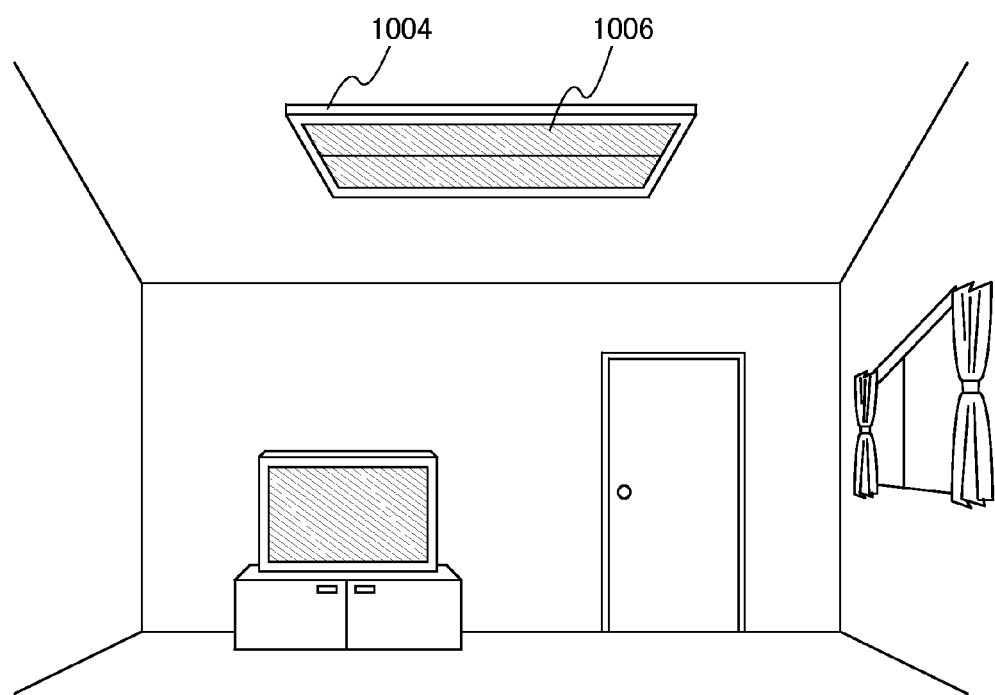

FIG. 5B illustrates an example in which the lighting device according to one embodiment of the present invention is used as an indoor lighting device. The indoor lighting device includes a housing 1004 and a lighting portion 1006. As the lighting portion 1006, the lighting device according to one embodiment of the present invention is used.

This application is based on Japanese Patent Application serial no. 2010-259052 filed with the Japan Patent Office on Nov. 19, 2010, the entire contents of which are hereby incorporated by reference.

What is claimed is:

1. A lighting device comprising:
a structure body including a first surface and a second surface which is opposite to the first surface of the structure body, the structure body including a negative Fresnel lens shape on a region of the first surface of the structure body;
a layer including a first surface and a second surface which is opposite to the first surface of the layer, the first surface of the layer being in direct contact with the first surface of the structure body; and
a light-emitting body which is over the structure body with the layer interposed therebetween, the light-emitting body being in direct contact with the second surface of the layer,
wherein the light-emitting body comprises a first electrode, a second electrode, and a light-emitting layer interposed therebetween,
wherein the layer includes a Fresnel lens shape at an interface with the region of the first surface of the structure body,
wherein the layer comprises a resin which is cured,
wherein the structure body and the layer are capable of transmitting light,
wherein a refractive index of the layer and a refractive index of a light-emitting region in the light-emitting body are higher than a refractive index of the structure body by 0.1 or more, and
wherein the region of the first surface of the structure body and the light-emitting region are in a concentric pattern.

2. The lighting device according to claim 1,
wherein the refractive index of the layer is higher than or equal to a value which is 0.1 lower than the refractive index of the light-emitting region in the light-emitting body.

3. The lighting device according to claim 1,
wherein the refractive index of the layer is higher than or equal to the refractive index of the light-emitting region in the light-emitting body.

4. The lighting device according to claim 1,
wherein the refractive index of the layer is lower than or equal to a value which is 0.1 higher than the refractive index of the light-emitting region in the light-emitting body.

5. The lighting device according to claim 1,
wherein the second surface of the layer, which is on the light-emitting body side, is plane or substantially plane.

6. The lighting device according to claim 1,
wherein the light-emitting body is a plane light-emitting body which emits light utilizing organic electroluminescence.

7. The lighting device according to claim 1,
wherein the region with the negative Fresnel lens shape is larger than the light-emitting region.

8. A lighting device comprising:
a structure body including a negative Fresnel lens shape on a region of a first surface of the structure body, and including a concave-convex shape on a region of a second surface opposite to the first surface of the structure body;
a layer including a first surface and a second surface which is opposite to the first surface of the layer, the first surface of the layer being in direct contact with the first surface of the structure body; and
a light-emitting body which is over the structure body with the layer interposed therebetween, the light-emitting body being in direct contact with the second surface of the layer,
wherein the light-emitting body comprises a first electrode, a second electrode, and a light-emitting layer interposed therebetween,
wherein the layer includes a Fresnel lens shape at an interface with the region of the first surface of the structure body,
wherein the layer comprises a resin which is cured,
wherein the structure body and the layer are capable of transmitting light, and
wherein a refractive index of the layer and a refractive index of a light-emitting region in the light-emitting body are higher than a refractive index of the structure body by 0.1 or more, and
wherein the region of the first surface of the structure body, the region of the second surface of the structure body, and the light-emitting region are in a concentric pattern.

9. The lighting device according to claim 8,
wherein the refractive index of the layer is higher than or equal to a value which is 0.1 lower than the refractive index of the light-emitting region in the light-emitting body.

10. The lighting device according to claim 8,
wherein the refractive index of the layer is higher than or equal to the refractive index of the light-emitting region in the light-emitting body.

11. The lighting device according to claim 8,
wherein the refractive index of the layer is lower than or equal to a value which is 0.1 higher than the refractive index of the light-emitting region in the light-emitting body.

12. The lighting device according to claim 8,
wherein the structure body includes a first member with the first surface including the region with the negative Fresnel lens shape and a second member with the second surface including the region with the concave-convex shape.

13. The lighting device according to claim 8,
wherein the structure body includes a first member with the first surface including the region with the negative Fresnel lens shape, a second member with the second surface including the region with the concave-convex shape, and a third member between the first member and the second member.

14. The lighting device according to claim 8,
wherein the second surface of the layer, which is on the light-emitting body side, is plane or substantially plane.

15. The lighting device according to claim 8,
wherein the region with the concave-convex shape is larger than the region with the negative Fresnel lens shape.

16. The lighting device according to claim 8,
wherein the concave-convex shape is a Fresnel lens shape.

17. The lighting device according to claim 8,
wherein the light-emitting body is a plane light-emitting body which emits light utilizing organic electroluminescence.

18. The lighting device according to claim 8,
wherein the region with the negative Fresnel lens shape is larger than the light-emitting region.

19. A lighting device comprising:
a structure body including:
a first negative Fresnel lens shape on a first region of a first surface of the structure body;
a second negative Fresnel lens shape on a second region of the first surface of the structure body; and
a concave-convex shape on a third region of a second surface opposite to the first surface of the structure body;
a layer including a first surface and a second surface which is opposite to the first surface of the layer, the first surface of the layer being in direct contact with the first surface of the structure body;
a first light-emitting body which is over the first region of the structure body with the layer interposed therebetween; and
a second light-emitting body which is over the second region of the structure body with the layer interposed therebetween,
wherein the layer includes a first Fresnel lens shape at an interface with the first region of the first surface of the structure body, and a second Fresnel lens shape at an interface with the second region of the first surface of the structure body,
wherein each of the first light-emitting body and the second light-emitting body is in direct contact with the second surface of the layer,
wherein each of the first light-emitting body and the second light-emitting body comprises a first electrode, a second electrode, and a light-emitting layer interposed therebetween,
wherein the layer comprises a resin which is cured,
wherein the structure body and the layer are capable of transmitting light, and
wherein a refractive index of the layer and refractive indices of light-emitting regions in the first light-emitting body and the second light-emitting body are higher than a refractive index of the structure body by 0.1 or more, and
wherein the first region of the first surface of the structure body, the third region of the second surface of the structure body, and the light-emitting region in the first light-emitting body are in a concentric pattern.

20. The lighting device according to claim 19,
wherein the refractive index of the layer is higher than or equal to a value which is 0.1 lower than the refractive indices of the light-emitting regions in the first light-emitting body and the second light-emitting body.

21. The lighting device according to claim 19,
wherein the refractive index of the layer is higher than or equal to the refractive indices of the light-emitting regions in the first light-emitting body and the second light-emitting body.

22. The lighting device according to claim 19,
wherein the refractive index of the layer is lower than or equal to a value which is 0.1 higher than the refractive indices of the light-emitting regions in the first light-emitting body and the second light-emitting body.

23. The lighting device according to claim 19,
wherein the second surface of the layer, which is on the first light-emitting body side, is plane or substantially plane.

24. The lighting device according to claim 19,
wherein each of the first light-emitting body and the second light-emitting body is a plane light-emitting body which emits light utilizing organic electroluminescence.

25. The lighting device according to claim 1, wherein the resin comprises bromine or sulfur.

26. The lighting device according to claim 1, wherein the layer comprises an inorganic material film.

27. The lighting device according to claim 8, wherein the resin comprises bromine or sulfur.

28. The lighting device according to claim 8, wherein the layer comprises an inorganic material film.

29. The lighting device according to claim 19, wherein the resin comprises bromine or sulfur.

30. The lighting device according to claim 19, wherein the layer comprises an inorganic material film.

* * * * *